United States Patent
Baik et al.

(10) Patent No.: US 12,417,695 B2
(45) Date of Patent: Sep. 16, 2025

(54) SYSTEM AND METHOD OF DIAGNOSING BATTERY CELLS THAT SUPPORT ONE-TO-MANY WIRELESS COMMUNICATION USING COMMON-FREQUENCY-CHANNEL AND MULTIPLE COMMUNICATION-FREQUENCY-CHANNELS

(71) Applicants: AIRPOINT CO., LTD.; Cell Point Co., LTD., Daejeon (KR)

(72) Inventors: Sung Jun Baik, Daejeon (KR); Jun Ho Cho, Daejeon (KR)

(73) Assignees: AIRPOINT CO., LTD., Daejeon (KR); Cell Point Co., LTD., Daejeon (KR)

( * ) Notice: Subject to any disclaimer, the term of this patent is extended or adjusted under 35 U.S.C. 154(b) by 186 days.

(21) Appl. No.: 18/332,839

(22) Filed: Jun. 12, 2023

(65) Prior Publication Data

US 2024/0331528 A1    Oct. 3, 2024

(30) Foreign Application Priority Data

Mar. 27, 2023    (KR) ........................ 10-2023-0039544

(51) Int. Cl.
*G08C 17/02*    (2006.01)
*G01R 31/371*    (2019.01)
(Continued)

(52) U.S. Cl.
CPC ........... *G08C 17/02* (2013.01); *G01R 31/371* (2019.01); *G01R 31/3842* (2019.01);
(Continued)

(58) Field of Classification Search
None
See application file for complete search history.

(56) References Cited

U.S. PATENT DOCUMENTS

2006/0178169 A1* 8/2006 Dunn, Jr. ............ H04M 1/6091
455/569.2
2016/0294019 A1* 10/2016 Yamauchi ............. H01M 10/48
(Continued)

FOREIGN PATENT DOCUMENTS

KR    10-2013-0026977    3/2013
KR    10-2015-0048439    5/2015
(Continued)

OTHER PUBLICATIONS

Office Action for Korea Patent Application No. 10-2023-0039544, mailed Sep. 10, 2024.

*Primary Examiner* — Jas A Sanghera

(57) ABSTRACT

Disclosed are a system and a method of diagnosing battery cells to support one-to-many wireless communication using a common-frequency-channel and multiple communication-frequency-channels, the system including a master BMS and multiple direct BMSs, wherein a battery cell connection unit included in each direct BMS contacts with positive and negative terminals of each battery cell included in a battery module, to measure raw data of a voltage of each battery cell and raw data of a current of the battery module, each of the direct BMSs transmits information of the battery module in contact with the direct BMS to a master BMS in an asynchronous wireless communication, and a common-frequency-channel and multiple communication-frequency-channels are efficiently assigned to a 900 MHz band, so that one-to-many wireless communication is stably operated without including a configuration adopted in a battery management system and related to a communication station passed through in the middle.

10 Claims, 18 Drawing Sheets

(51) Int. Cl.
  *G01R 31/3842*  (2019.01)
  *G01R 31/396*   (2019.01)
  *H04W 4/06*     (2009.01)
  *H04W 72/0453*  (2023.01)

(52) U.S. Cl.
  CPC ............ *G01R 31/396* (2019.01); *H04W 4/06* (2013.01); *H04W 72/0453* (2013.01)

(56) References Cited

U.S. PATENT DOCUMENTS

| | | | |
|---|---|---|---|
| 2017/0351561 A1 | 12/2017 | Yamazoe et al. | |
| 2021/0037407 A1* | 2/2021 | Park | H01M 10/4207 |
| 2021/0281988 A1* | 9/2021 | Han | B60L 58/18 |

FOREIGN PATENT DOCUMENTS

| | | |
|---|---|---|
| KR | 10-2018-0132896 | 12/2018 |
| KR | 10-2019-0005407 | 1/2019 |
| KR | 10-2023-0004400 | 1/2023 |

* cited by examiner

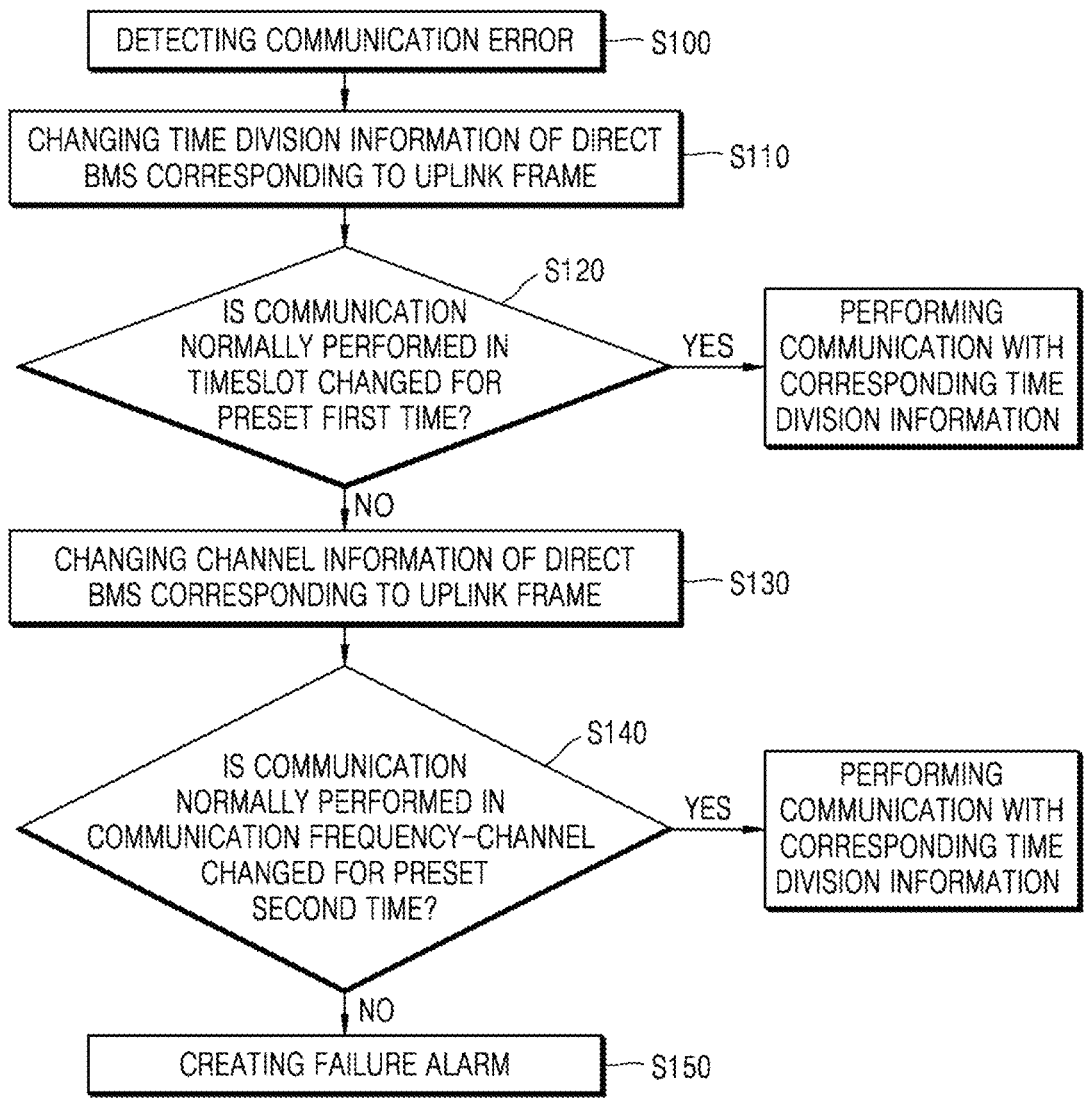

SYSTEM AND METHOD OF DIAGNOSING BATTERY CELLS THAT SUPPORT ONE-TO-MANY WIRELESS COMMUNICATION USING COMMON-FREQUENCY-CHANNEL AND MULTIPLE COMMUNICATION-FREQUENCY-CHANNELS

BACKGROUND OF THE INVENTION

1. Field of the Invention

The present invention relates to a system and a method of diagnosing battery cells to support one-to-many wireless communication using a common-frequency-channel and multiple communication-frequency-channels, and more particularly, to a system and a method of diagnosing battery cells to support one-to-many wireless communication using a common-frequency-channel and multiple communication-frequency-channels, which includes a master BMS and multiple direct BMSs, wherein a battery cell connection unit included in each direct BMS comes into direct contact with a positive terminal and a negative terminal of each of multiple battery cells included in a battery module, so as to measure raw data of a voltage of each battery cell and raw data of a current of the battery module, each of the direct BMSs transmits information of the battery module in contact with the direct BMS to a master BMS in an asynchronous wireless communication manner, and a common-frequency-channel and multiple communication-frequency-channels are efficiently assigned to a 900 MHz band serving as an unlicensed communication band, so that one-to-many wireless communication between multiple direct BMSs and a single master BMS is stably operated without including a configuration adopted in a battery management system which includes a conventional slave BMS or module BMS and related to a communication station passed through in the middle.

2. Description of the Related Art

Recently, environmental regulations for vehicles having internal combustion engines have been gradually severe all over the world, and accordingly, demands for vehicles, such as electric vehicles (EVs) or hybrid vehicles (MHEVs, PHEVs and FHEVs), using battery power as motive power have increased. As a result, automotive companies around the world have been increasingly interested in battery management technologies for improving efficiency, performance and durability of batteries, and researches and developments related to the technologies are being actively conducted in various companies and research organizations.

In addition, since these electric vehicles have longer charging times and shorter distance-to-empty compared to the conventional internal combustion engine vehicles, automobile companies tend to install large-capacity batteries in electric vehicles in order to ensure the longest distance-to-empty. However, the large-capacity battery contains thousands of battery cells. As the number of battery cells installed in vehicles is increased, the importance of a battery management system (BMS) for managing and controlling batteries with an increased capacity has also been gradually spotlighted.

The conventional battery management system such as Korean Unexamined Pat. No. 10-2015-0048439 has a structure in which a predetermined number of battery cells are modularized into a battery module and then battery modules are connected to slave BMSs, respectively, to check a status of the corresponding module and transmit the status to a master BMS. In addition, when the number of battery cells is increased as described above, the number of cables for connecting each battery cell to the slave BMS and connecting the slave BMS to the master BMS is gradually increased, and accordingly, the problems caused thereby are gradually increased.

In addition, the related art for wirelessly connecting multiple slave BMSs to a master BMS, such as Korean Unexamined Pat. No. 10-2023-0004400, is also disclosed. However, the disclosure still adopts a wired connection scheme using electric/communication cables between batteries and the BMSs, there is no disclosure or suggestion about a wireless communication system in consideration of the specificity of the vehicle, and there is no mention about a configuration capable of reducing costs and increasing space utilization while enabling stable communication.

Accordingly, a noble type of BMS technology for improving the problems of the above-mentioned conventional BMS technology is required.

(Patent Document 1) Korean Unexamined Publication Pat. No. 10-2015-0048439 (May 7, 2015)
(Patent Document 2) Korean Unexamined Publication Pat. No. 10-2023-0004400 (Jan. 6, 2023)

SUMMARY OF THE INVENTION

The present invention relates to a system and a method of diagnosing battery cells to support one-to-many wireless communication using a common-frequency-channel and multiple communication-frequency-channels, and more particularly, an object of the present invention is to provide a system and a method of diagnosing battery cells to support one-to-many wireless communication using a common-frequency-channel and multiple communication-frequency-channels, which includes a master BMS and multiple direct BMSs, wherein a battery cell connection unit included in each direct BMS comes into direct contact with a positive terminal and a negative terminal of each of multiple battery cells included in a battery module, so as to measure raw data of a voltage of each battery cell and raw data of a current of the battery module, each of the direct BMSs transmits information of the battery module in contact with the direct BMS to a master BMS in an asynchronous wireless communication manner, and a common-frequency-channel and multiple communication-frequency-channels are efficiently assigned to a 900 MHz band serving as an unlicensed communication band, so that one-to-many wireless communication between multiple direct BMSs and a single master BMS is stably operated without including a configuration adopted in a battery management system which includes a conventional slave BMS or module BMS and related to a communication station passed through in the middle.

In order to solve the above problem, one embodiment of the present invention provides a system of diagnosing battery cells positioned inside a vehicle, which includes: multiple direct BMSs disposed inside the vehicle and electrically connected to multiple battery cells included in a battery module; and a master BMS disposed inside the vehicle to perform wireless communication with the direct BMSs, wherein the direct BMS includes: a battery cell connection unit having ports coming into physically and electrically direct contact with exposed electrodes of the battery cells, respectively; a voltage measurement unit electrically connected to the battery cell connection unit and having a circuit form to measure a voltage of each battery cell; a current measurement unit electrically connected to the battery cell connection unit and having a circuit form to measure a current of the battery cell or the battery module; an MCU; and a first wireless communication unit connected to the MCU to perform wireless communication with the master BMS, wherein the master BMS sets a communication-frequency-channel for each direct BMS located inside the vehicle and broadcasts broadcasting data including channel information about the communication-frequency-channel for each direct BMS on a common-frequency-channel at a preset cycle, and the direct BMS is set to receive data transmitted through the common-frequency-channel, and transmits and receives information related to a battery cell to/from the master BMS through the direct BMS's own communication-frequency-channel included in the broadcasting data received on the common-frequency-channel.

According to one embodiment of the present invention, both of a positive terminal and a negative terminal of the battery cell may come into direct contact with a port provided in the battery cell connection unit, and the voltage measurement unit may measure a voltage of each battery cell.

According to one embodiment of the present invention, the communication-frequency-channel corresponds to a channel through which data is wirelessly transmitted and received between the multiple direct BMSs and the master BMS, and includes multiple communication frames, wherein the communication frame includes a sub-frame including: a downlink frame broadcasted by the master BMS to the direct BMSs; and multiple uplink frames transmitted by each of the direct BMSs to the master BMS, in which each uplink frame in the sub-frame may be temporally divided.

According to one embodiment of the present invention, the data received by the direct BMSs through the downlink frame in the communication-frequency-channel includes: identifier information of each direct BMS; and time division information of an uplink frame related to the direct BMS having the corresponding identifier information, and each direct BMS may transmit data about the battery cell connected to the direct BMS to the master BMS through an uplink frame assigned to the direct BMS, based on time division information and channel information of the direct BMS's own uplink frame included in the data received by the downlink frame.

According to one embodiment of the present invention, each of the communication-frequency-channel and the common-frequency-channel corresponds to a 900 MHz band, in which types of data transmitted and received through each channel may be different from each other.

According to one embodiment of the present invention, the communication-frequency-channel may include multiple narrowband channels divided at 200 KHz intervals in the 900 MHz band.

According to one embodiment of the present invention, a communication frame of the communication-frequency-channel may include multiple identical sub-frames, the sub-frame may be temporally configured to have multiple uplink frames subject to preset rules after the downlink frame, data broadcasted in the downlink frame may include request information about a target to be transmitted from each direct BMS, and each direct BMS may generate response information according to the request information included in the data broadcasted in the downlink frame, so that data including the response information may be transmitted to the master BMS according to the time division information and the channel information of the direct BMS's own uplink frame.

According to one embodiment of the present invention, when the master BMS detects a communication error during communication with the multiple direct BMS, the master BMS may change time division information of a direct BMS corresponding to an uplink frame in which the communication error occurs, and then broadcast data including the changed time division information through a communication-frequency-channel.

In another embodiment of the present invention, when the master BMS detects a communication error during communication with the multiple direct BMS, the master BMS may change channel information of a direct BMS corresponding to an uplink frame in which the communication error occurs, and then broadcast broadcasting data including the changed channel information through a common-frequency-channel.

According to one embodiment of the present invention, a cycle of the communication frame transmitted and received by the direct BMS and the master BMS or a time interval between consecutive data frames may vary according to a driving condition of the vehicle in which the battery module is installed.

In order to solve the above problem, one embodiment of the present invention provides a method of diagnosing battery cells performed by the system of diagnosing the battery cells positioned inside a vehicle. The system of diagnosing the battery cells includes: multiple direct BMSs disposed inside the vehicle and electrically connected to multiple battery cells included in a battery module; and a master BMS disposed inside the vehicle to perform wireless communication with the direct BMSs. The method of diagnosing the battery cells includes the steps of: physically and electrically bringing a port included in the battery cell connection unit into direct contact with an exposed electrode of each of the battery cells, by a battery cell connection unit of the direct BMS; measuring a voltage of each battery cell, by a voltage measurement unit of the direct BMS; measuring a current of the battery cell or the battery module, by a current measurement unit of the direct BMS; and performing wireless communication with the master BMS, by a first wireless communication unit of the direct BMS, wherein the first wireless communication unit may be connected to an MCU of the direct BMS, the master BMS may set a communication-frequency-channel for each direct BMS located inside the vehicle and broadcast broadcasting data including channel information about the communication-frequency-channel for each direct BMS on a common-frequency-channel at a preset cycle, and the direct BMS may be set to receive data transmitted through the common-frequency-channel and transmit and receive information related to a battery cell to/from the master BMS through the direct BMS's own communication-frequency-channel included in the broadcasting data received on the common-frequency-channel.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the direct BMS is configured to physically and electrically come into direct contact with each of the battery cells, thereby measuring voltage information on each of the battery cells, so that the conventional problem that a predetermined number of battery cells among a plurality of battery cells have different voltages and generate noise that cannot be corrected can be solved, and accordingly, data having more reliability can be obtained.

According to one embodiment of the present invention, a master BMS and a plurality of direct BMSs connected to each of a plurality of battery modules perform asynchronous wireless communication, so that the problems caused by applying or installing an isolator to a plurality of positions to prevent electro-magnetic interference from being induced in the wired communication system of the related art, such as deterioration in space efficiency, increase in weight, and increase in cost, can be solved.

According to one embodiment of the present invention, a plurality of direct BMSs and a master BMS connected to each of a plurality of battery modules include a communication modem capable of modulating a digital signal into a differential phase shift modulation signal or demodulating a differential phase shift modulation signal into a digital signal so as to perform asynchronous wireless communication, so that the communication module for performing the asynchronous wireless communication can have a simple structure but have a good frequency efficiency, and stable wireless communication can be implemented even in the special environment of a vehicle.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

According to one embodiment of the present invention, an independent common-frequency-channel for performing downlink communication only is operated, so that reliability of data transmission and reception can be ensured.

According to one embodiment of the present invention, when an error occurs in communication, time division information and channel information of the uplink frame of the direct BMS are individually changed through a self-regulating error correction configuration, so that reliability of the wireless communication system can be ensured.

BRIEF DESCRIPTION OF THE DRAWINGS

FIG. 18 schematically shows steps of performing a self-regulating error correction configuration according to one embodiment of the present invention.

DETAILED DESCRIPTION OF THE INVENTION

1. System And Method Of Diagnosing Battery Cells Using Asynchronous Wireless Communication Hereinafter, the invention of transmitting and receiving data between a master BMS and a direct BMS using a differential phase shift modulation signal serving as an asynchronous wireless communication signal will be described.

2. System and Method of Diagnosing Battery Cells to Support One-to-Many Wireless Communication Using Common-Frequency-Channel and Multiple Communication-Frequency-Channels Hereinafter, a wireless communication system in a diagnosis system, to which the invention described in the above-mentioned 1. System And Method Of Diagnosing Battery Cells Using Asynchronous Wireless Communication is applied, will be described. The wireless communication system is characterized in that independently operates a common-frequency-channel and communication-frequencychannels in a 900 MHz frequency band having a predetermined bandwidth, so that a master BMS and multiple direct BMSs included in the diagnosis system may stably perform wireless communication.

Figure 12:
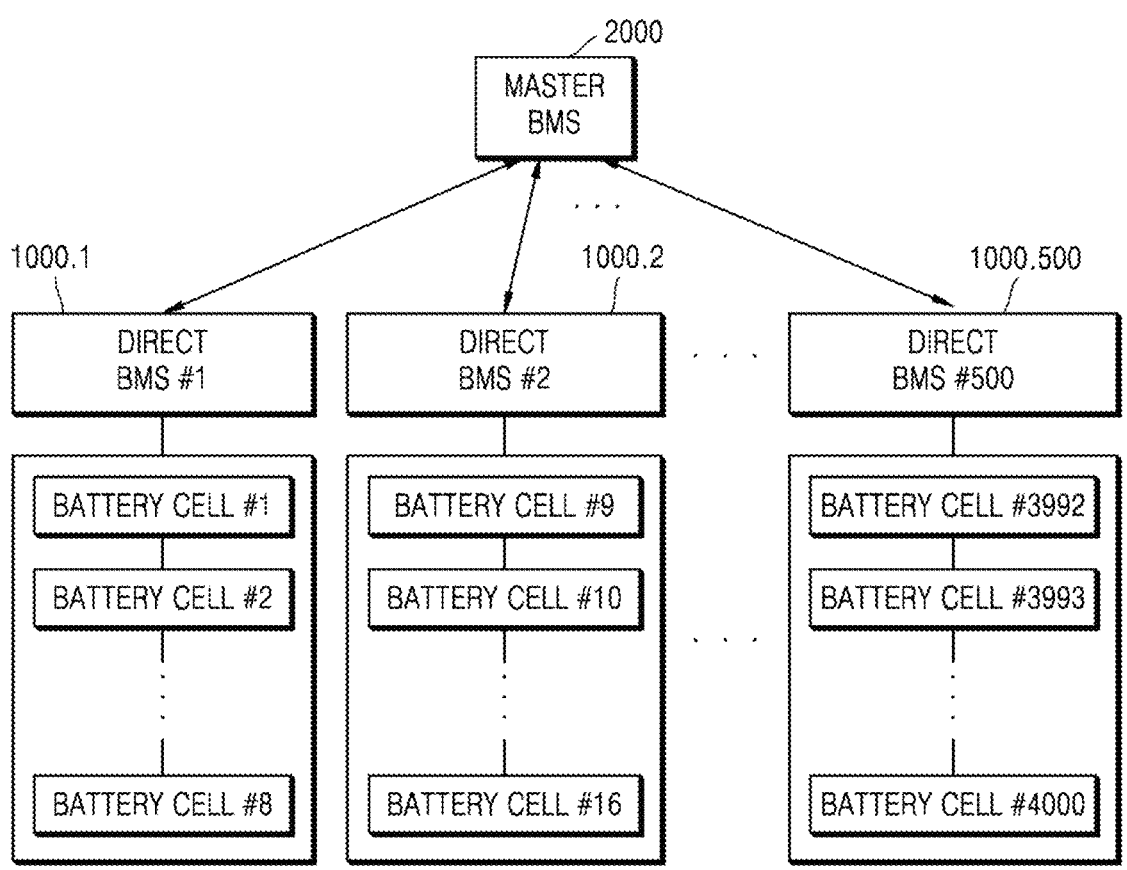
FIG. 12 schematically shows the configuration of a system of diagnosing battery cells according to another embodiment of the present invention.

FIG. 12 schematically shows the configuration of a diagnosis system of battery cells applied to an electric vehicle according to one embodiment of the present invention.

As shown in FIG. 12, a system of diagnosing battery cells positioned inside a vehicle includes: multiple direct BMSs 1000 disposed inside the vehicle and electrically connected to multiple battery cells included in a battery module; and a master BMS 2000 disposed inside the vehicle to perform wireless communication with the direct BMSs 1000, wherein the direct BMS 1000 includes: a battery cell connection unit having ports coming into physically and electrically direct contact with exposed electrodes of the battery cells, respectively; a voltage measurement unit electrically connected to the battery cell connection unit and having a circuit form to measure a voltage of each battery cell; a current measurement unit electrically connected to the battery cell connection unit and having a circuit form to measure a current of the battery cell or the battery module; an MCU; and a first wireless communication unit connected to the MCU to perform wireless communication with the master BMS 2000.

Figure 1:
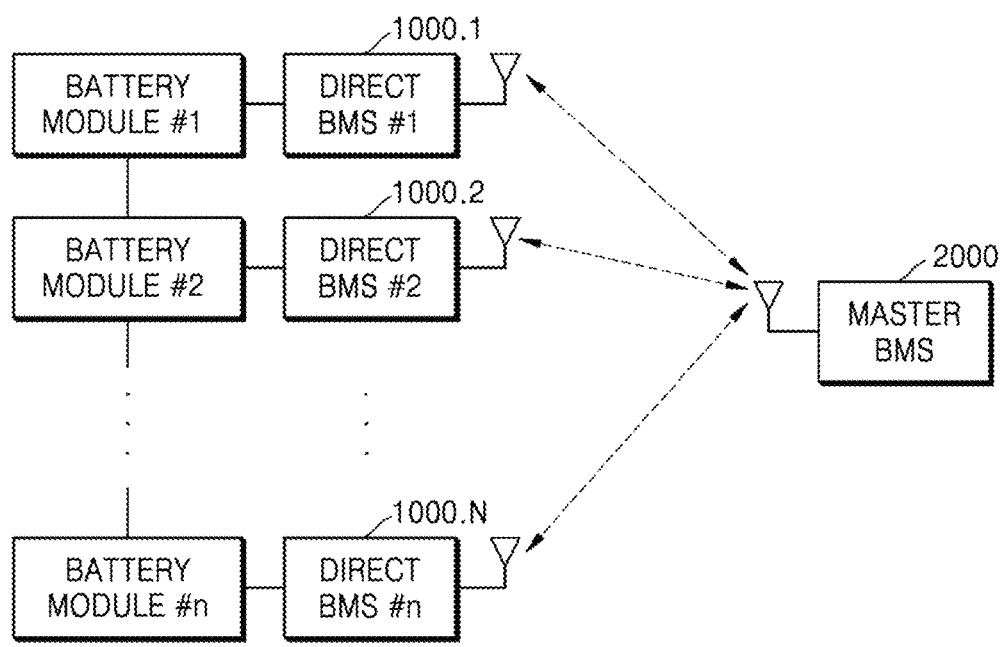
FIG. 1 schematically shows the configuration of a system of diagnosing battery cells according to one embodiment of the present invention.
Figure 2:
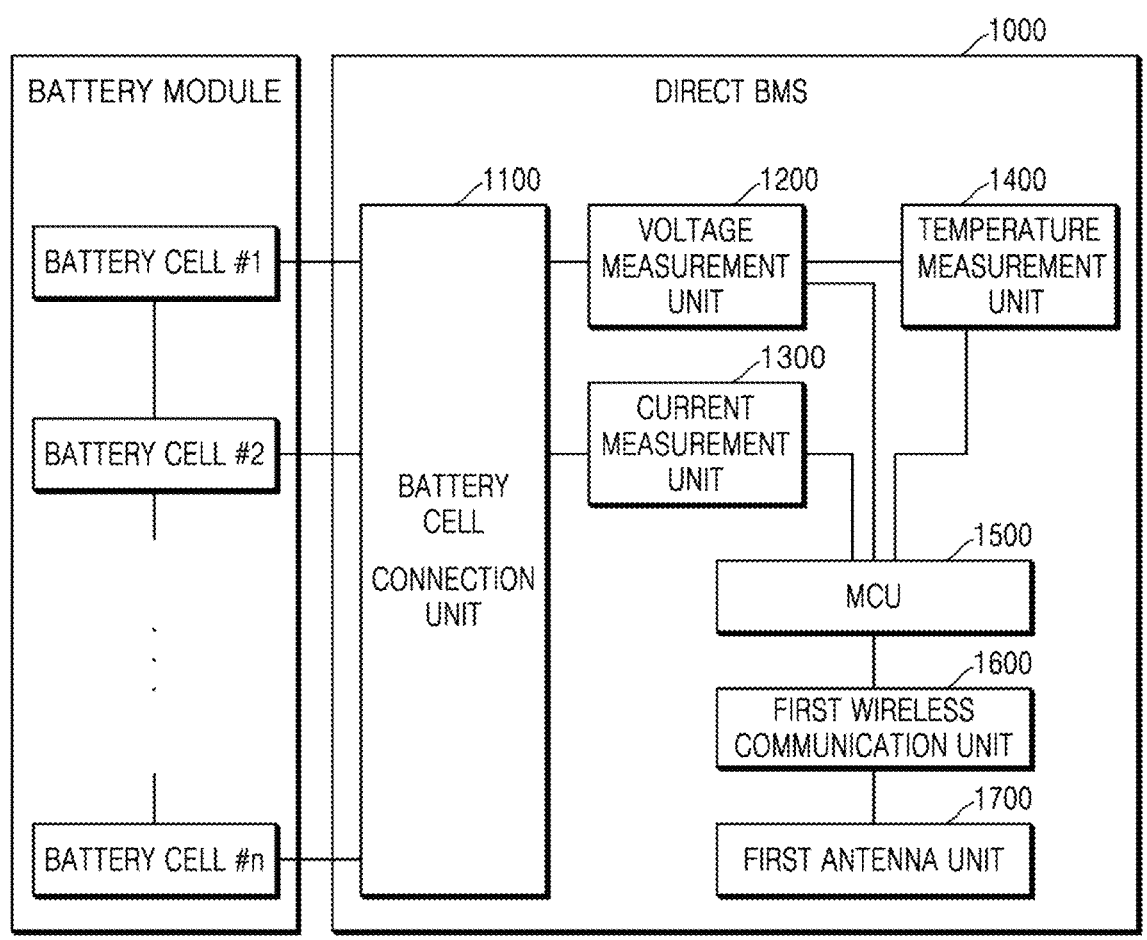
FIG. 2 schematically shows the internal configuration of a direct BMS according to one embodiment of the present invention.
Figure 3:
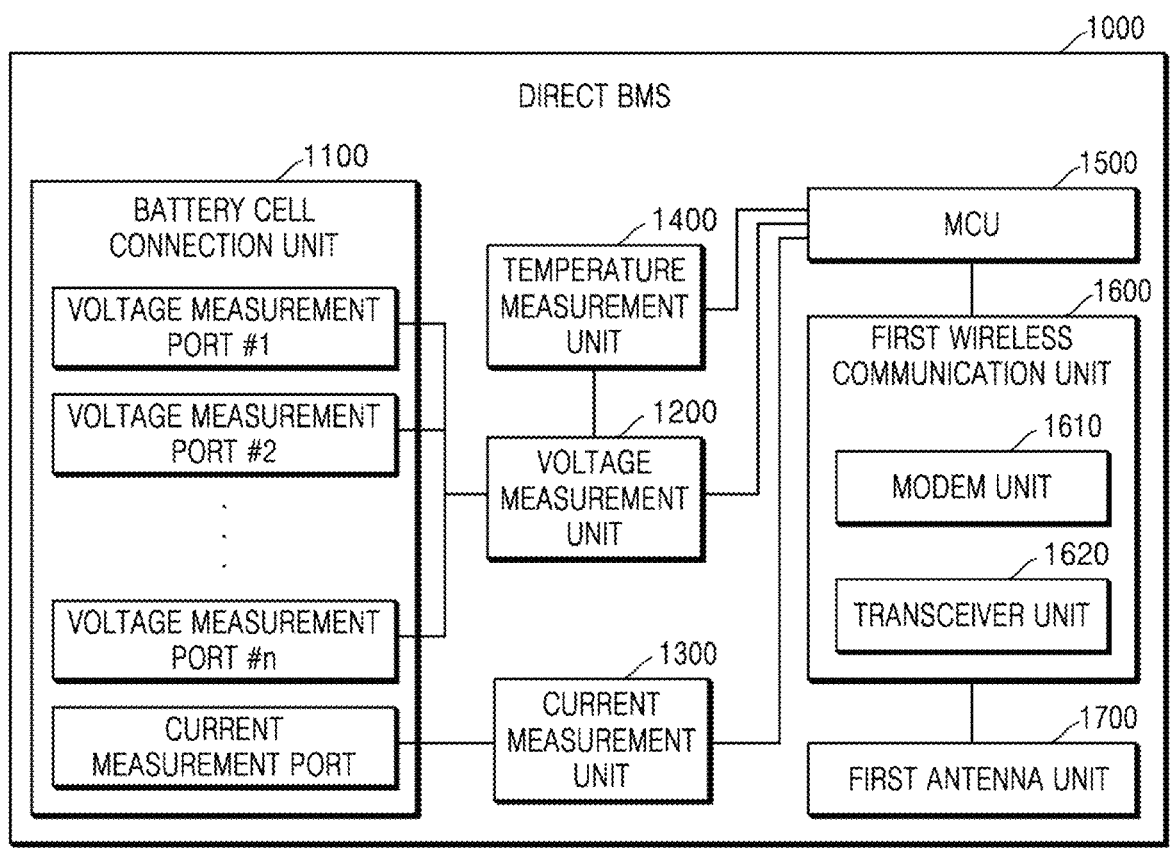
FIG. 3 schematically shows the internal configuration of a direct BMS according to another embodiment of the present invention.
Figure 4:
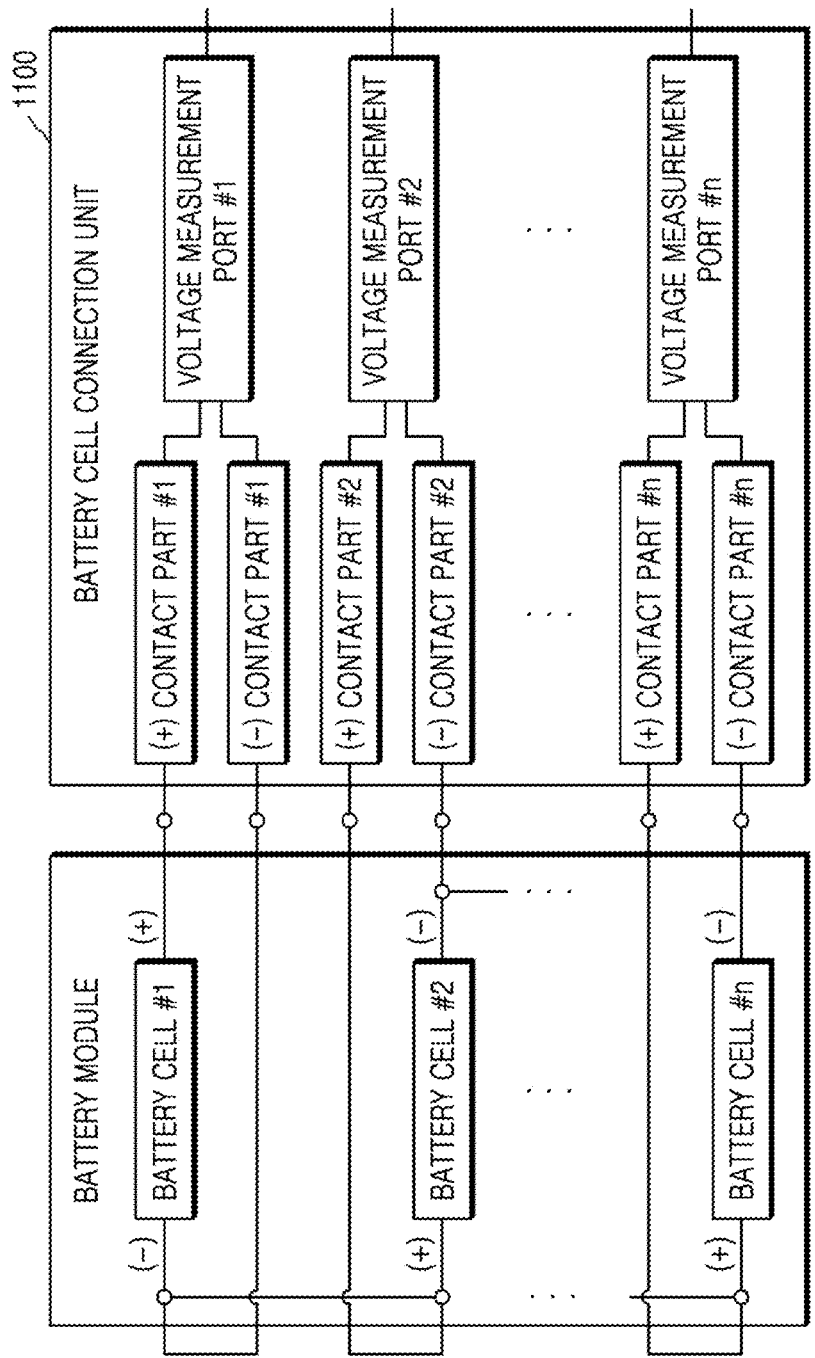
FIG. 4 schematically shows the configuration of a battery module and a battery cell connection unit according to one embodiment of the present invention.

As a whole, in one embodiment of the present invention, FIG. 12 shows an embodiment in which the battery cell diagnosis system shown in FIG. 1 is applied to batteries mounted in an electric vehicle. Like FIG. 1, FIG. 12 shows that solid lines illustrate a relationship physically directly contacted to be electrically connected, and dotted lines illustrate a relationship of wirelessly transmitting and receiving data.

Specifically, the electric vehicle to which the embodiment shown in FIG. 12 is applied may use eight battery cells as one battery module, and may include a battery pack containing 500 battery modules. In the diagnostic system of the present invention applied to the above vehicle, multiple direct BMSs 1000.1 to 1000.500 (hereinafter 1000) are physically and electrically directly connected to the battery modules, respectively, and each direct BMS 1000 wirelessly transmits information about each or all of the battery cells of the connected battery module to a single master BMS 2000.

Figure 5:
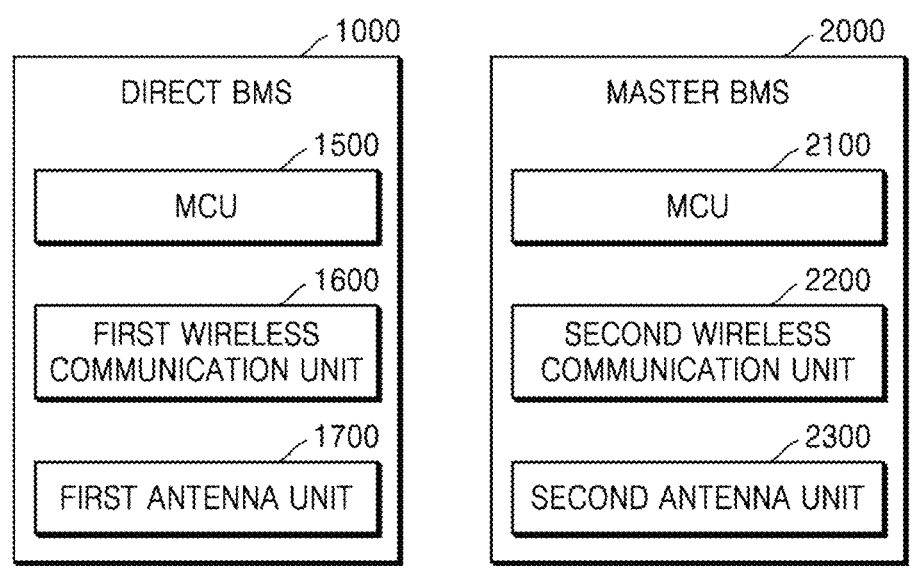
FIG. 5 schematically shows the internal configuration for performing asynchronous wireless communication in each of the direct BMS and the master BMS according to one embodiment of the present invention.
Figure 6:
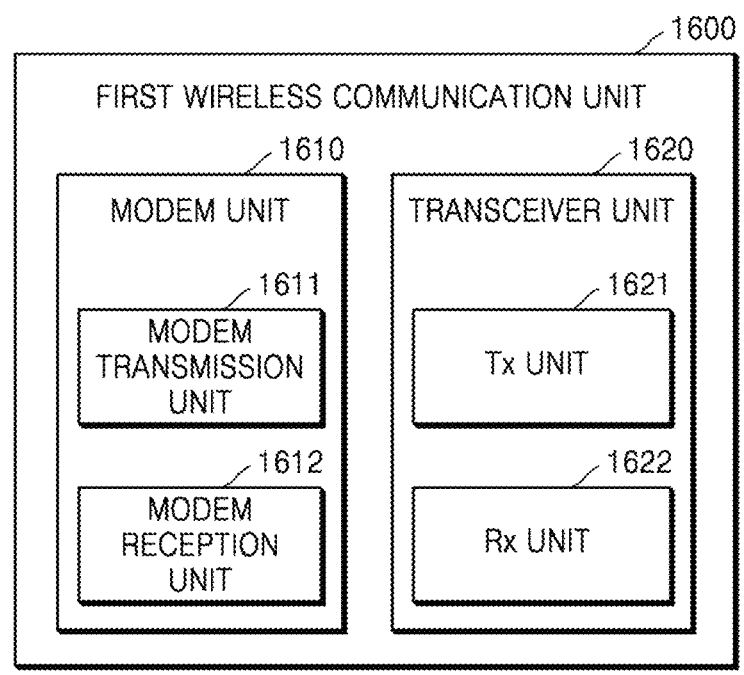
FIG. 6 schematically shows the internal configuration of a first wireless communication unit according to one embodiment of the present invention.
Figure 7:
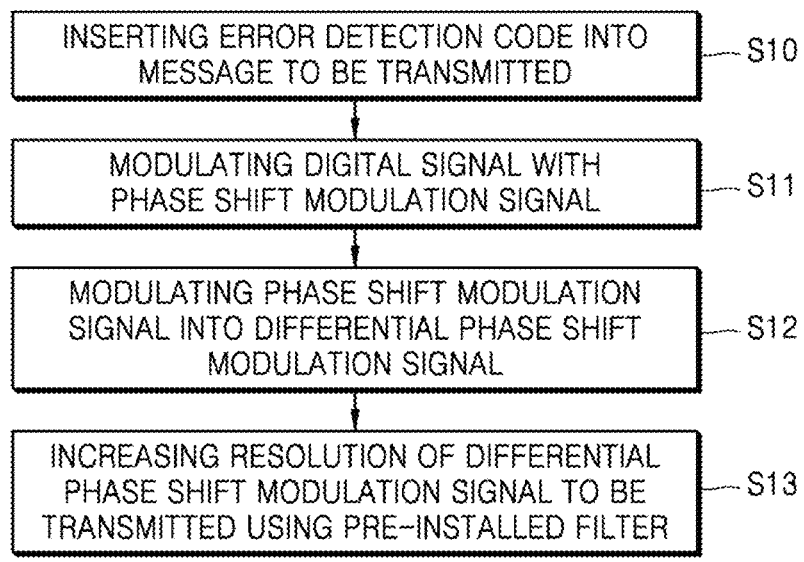
FIG. 7 schematically shows performing steps of a data transmission step performed by a modem transmission unit and a Tx unit according to one embodiment of the present invention.
Figure 8:
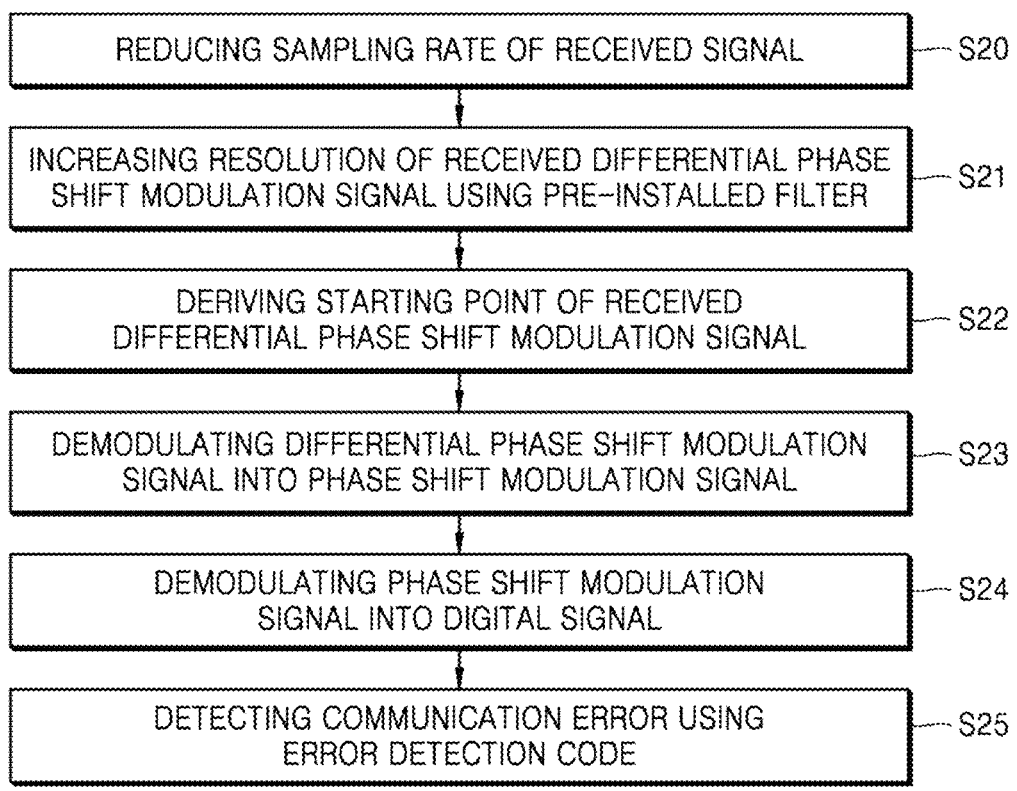
FIG. 8 schematically shows performing steps of data reception step performed by a modem reception unit and an Rx unit according to one embodiment of the present invention.

Referring to FIG. 5, each of the direct BMSs 1000 includes a first wireless communication unit 1600.1 to 1600.500 (hereinafter 1600), the master BMS 2000 includes a second wireless communication unit 2200, and each first wireless communication unit 1600 performs wireless communication with the second wireless communication unit 2200 through an asynchronous wireless communication signal (DPSMS).

In addition, the first wireless communication unit 1600 and the second wireless communication unit 2200 may include an FIR filter. In one embodiment of the present invention, the second antenna unit 2300 connected to the second wireless communication unit 2200 may preferably include two antennas. According to the above embodiment, the master BMS may use both of the antennas upon reception and may use only one antenna upon transmission.

In other words, it is the core of the battery diagnosis system using wireless communication in electric vehicles in that the master BMS 2000 is required to receive information related to each battery cell from the first wireless communication unit 1600 of the five hundred direct BMSs 1000 without interference, and check the battery status in real time, and the wireless communication system can last for more than 10 years in various environments (for example, cold, hot, with lots of vibration, or the like). Hereinafter, the wireless communication system of the present invention, which is invented in consideration of the core for supporting one-to-many communication between a master BMS 2000 and multiple direct BMSs 1000, will be described.

Figure 13:
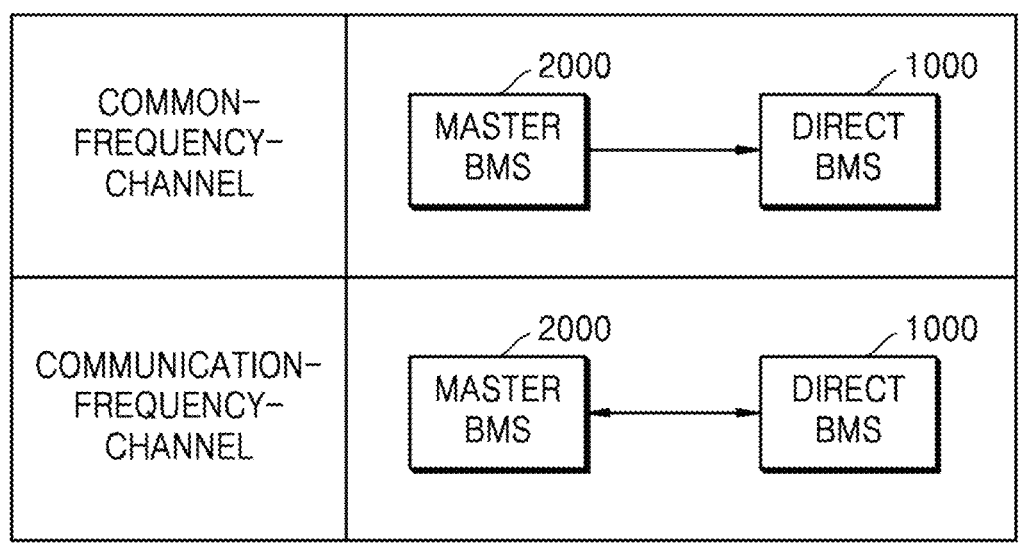
FIG. 13 schematically shows a communication state of the battery cell diagnosis system in the common-frequency-channel and the communication-frequency-channel according to one embodiment of the present invention.

FIG. 13 schematically shows a communication state of the battery cell diagnosis system in the common-frequency-channel and the communication-frequency-channel according to one embodiment of the present invention.

As shown in FIG. 13, the master BMS 2000 sets a communication-frequency-channel for each direct BMS 1000 located inside the vehicle and broadcasts broadcasting data including channel information about the communication-frequency-channel for each direct BMS 1000 on a common-frequency-channel at a preset cycle, and the direct BMS 1000 is set to receive data transmitted through the common-frequency-channel, and transmits and receives information related to a battery cell to/from the master BMS 2000 through the direct BMS's own communication-frequency-channel included in the broadcasting data received on the common-frequency-channel.

In addition, each of the communication-frequency-channel and the common-frequency-channel corresponds to a 900 MHz band, in which types of data transmitted and received through each channel are different from each other, and the communication-frequency-channel includes multiple narrowband channels divided at 200 KHz intervals in the 900 MHz band.

Specifically, in the above-described 1. System And Method Of Diagnosing Battery Cells Using Asynchronous Wireless Communication, a downlink frame and multiple uplink frames are set based on time division information divided by time in a communication frame in a single frequency band. However, as shown in FIG. 12, when the master BMS 2000 and the multiple direct BMSs 1000 communicate through the communication frame structure shown in FIG. 9 in a single frequency band with respect to information about each of the five hundred direct BMSs 1000, and when a cycle of one communication frame (=0.8 ms*500=400 ms) becomes too long and information transmitted from a specific direct BMS 1000 is not normally received by the master BMS 2000, 405 ms is required to receive information from the direct BMS 1000 again, and accordingly, reliability on data is very lowered.

In order to solve the above problem, a wireless communication system including a communication-frequency-channel composed of multiple narrowband channels having a bandwidth of 200 KHz and a common-frequency-channel independent of the communication-frequency-channel is applied to the system and the method of diagnosing battery cells of the present invention.

More specifically, as shown in FIG. 13, the common-frequency-channel supports only communication from the master BMS 2000 to the multiple direct BMSs 1000, that is, downlink communication, and the communication-frequency-channel supports both of communication from the direct BMS 1000 to the master BMS 2000, that is, uplink communication and the above downlink communication.

Both of the common-frequency-channel and the communication-frequency-channel are assigned to a 900 MHZ band, and each of the channels has a unique frequency band so as to be prevented from interfering with each other. The common-frequency-channel corresponds to a channel for always enabling transmission with the master BMS 2000 and always enabling all of the direct BMSs 1000 to receive.

In addition, the communication-frequency-channel may be composed of multiple narrowband channels, and each of the direct BMSs 1000 may perform data communication wirelessly with the master BMS 2000 through a direct BMS's own narrowband channel set by the master BMS 2000. In other words, the master BMS 2000 may broadcast broadcasting data including channel information about the communication-frequency-channel for each of the direct BMSs 1000 at a preset cycle through downlink communication in the common-frequency-channel, and each of the direct BMSs 1000 receiving the broadcasting data may transmit information related to the battery cell connected to the direct BMS to the master BMS 2000 through the direct BMS's own communication-frequency-channel included in the received broadcasting data. Hereinafter, the common-frequency-channel and the communication-frequency-channel will be described in detail.

Figure 14:
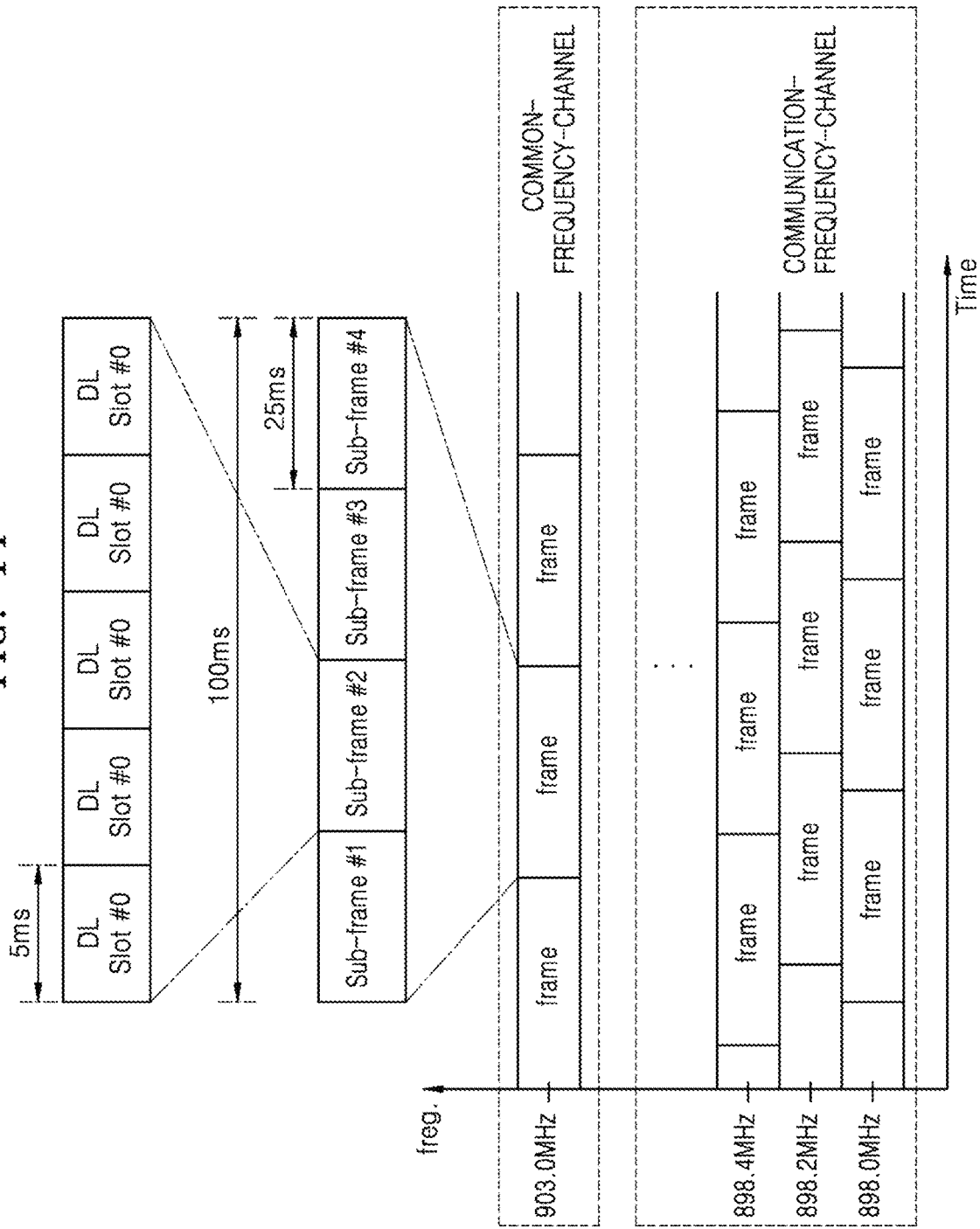
FIG. 14 schematically shows a structure of a communication frame in a common-frequency-channel according to one embodiment of the present invention.
Figure 15:
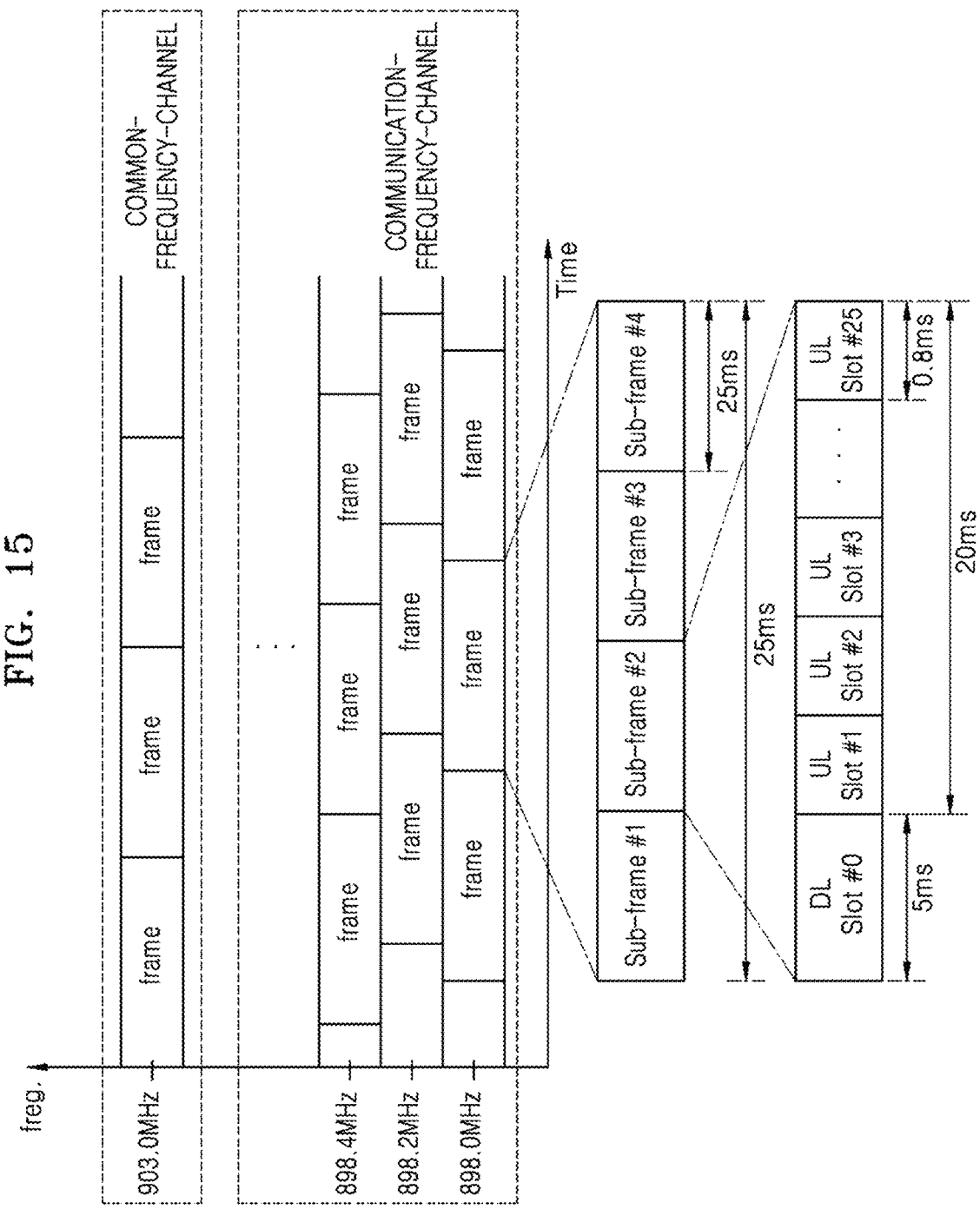
FIG. 15 schematically shows a structure of a communication frame in a communication-frequency-channel according to one embodiment of the present invention.

FIG. 14 schematically shows a structure of a communication frame in a common-frequency-channel according to one embodiment of the present invention. FIG. 15 schematically shows a structure of a communication frame in a communication-frequency-channel according to one embodiment of the present invention.

As shown in FIGS. 14 and 15, the common-frequency-channel and the communication-frequency-channel correspond to a channel through which data is wirelessly transmitted and received between the direct BMSs 1000 and the master BMS 2000, and include multiple communication frames, wherein the communication frame includes a sub-frame including: a downlink frame broadcasted by the master BMS 2000 to the direct BMSs 1000; and multiple uplink frames transmitted by each of the direct BMSs 1000 to the master BMS 2000, wherein each of the uplink frames in the sub-frame is temporally divided, the data received by the direct BMSs 1000 through the downlink frame in the communication-frequency-channel includes: identifier information of each direct BMS 1000; and time division information of an uplink frame related to the direct BMS 1000 having the corresponding identifier information, wherein each direct BMS 1000 transmits data about the battery cell connected to the direct BMS to the master BMS through the uplink frame assigned to the direct BMS based on time division information and channel information of the direct BMS's own uplink frame included in the data received by the downlink frame.

In addition, a communication frame of the communication-frequency-channel may include multiple identical sub-frames, the sub-frame is temporally configured to have multiple uplink frames subject to preset rules after the downlink frame, data broadcasted in the downlink frame includes request information about a target to be transmitted from each direct BMS 1000, and each direct BMS 1000 generates response information according to the request information included in the data broadcasted in the downlink frame and transmits data including the response information to the master BMS 2000 according to time division information and the channel information of the direct BMS's own uplink frame.

As a whole, in one embodiment of the present invention, FIGS. 14 and 15 shows a communication system in which a band of 903 MHz is set as a common-frequency-channel and a band of 898.0 MHz to 902.8 MHz is set as a communication-frequency-channel, for convenience of description. However, the configuration related to the frequencies assigned to each of the common-frequency-channel and the communication-frequency-channel is a configuration that may be changed in design according to the intention of the inventor. In other words, the common-frequency-channel may be set to any end of limited 900 MHz bands, but the frequency band of the common-frequency-channel may correspond to any one of the limited 900 MHz bands according to another embodiment of the present invention.

In addition, FIGS. 14 and 15 show that each of the common-frequency-channel and the multiple communication-frequency-channels is a communication channel having a bandwidth of 200 KHz. However, the bandwidth of the common-frequency-channel may be changed in design at any time according to the intention of the inventor according to another embodiment of the present invention.

In addition, although FIGS. 14 and 15 show that multiple narrowband channels are adjacent to each other for further understanding of the present invention, it may be substantially preferable, in the present invention, that a guard band for preventing interference between channels is provided between successive channels.

Figure 9:
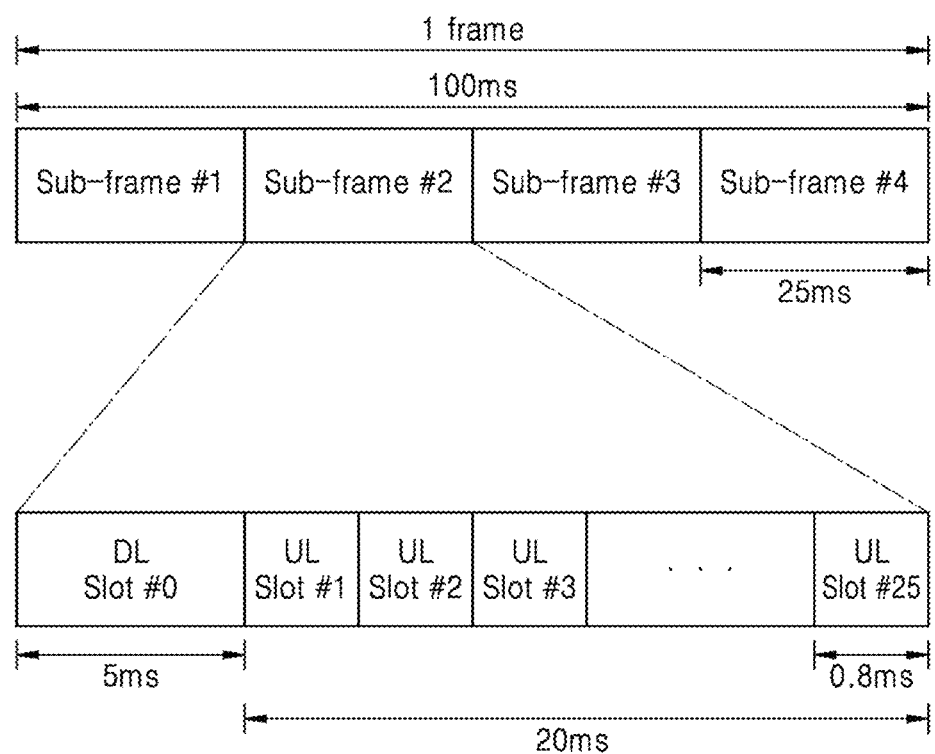
FIG. 9 schematically shows the structure of a communication frame in asynchronous wireless communication performed between a master BMS and multiple direct BMSs according to one embodiment of the present invention.
Figure 10:
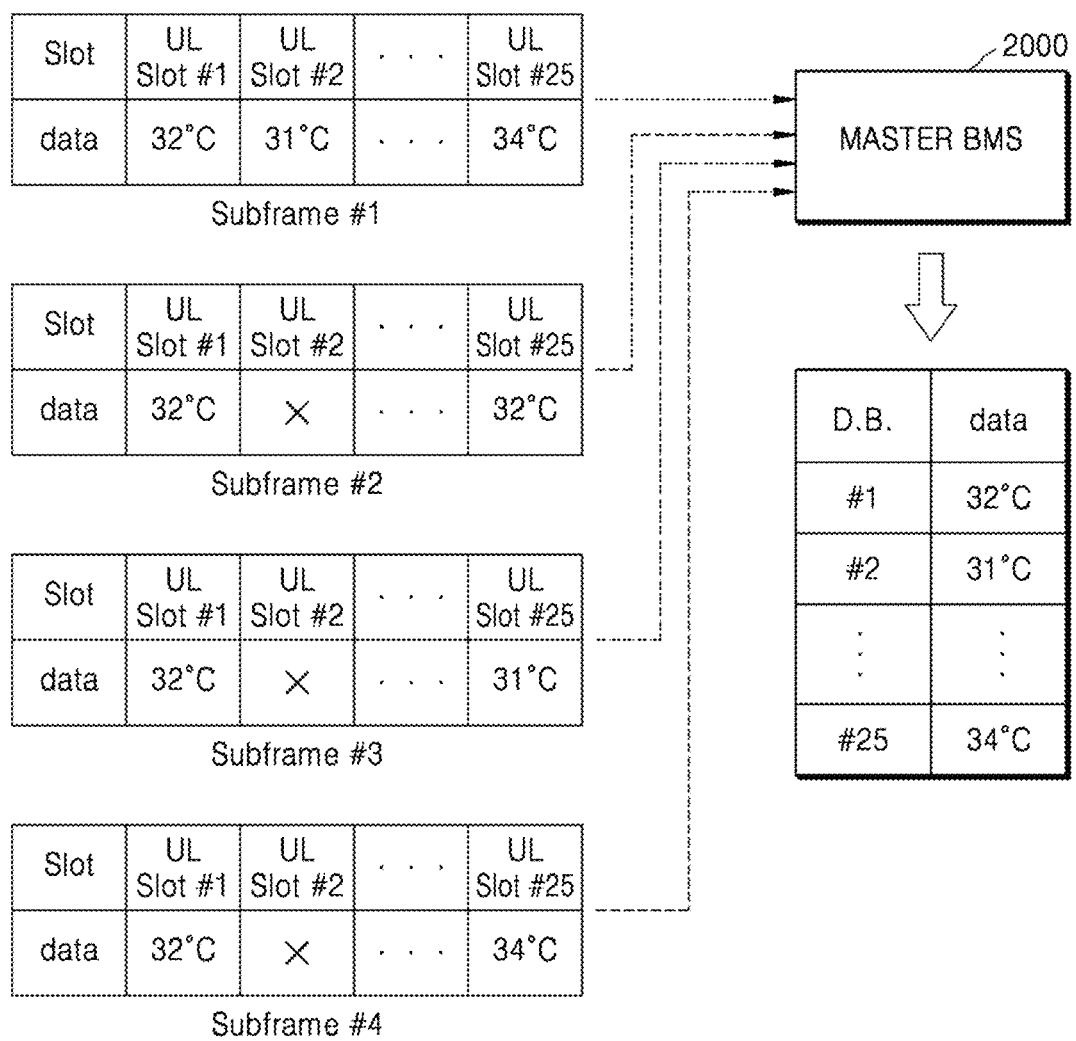
FIG. 10 schematically shows a process of processing information received by a master BMS from multiple direct BMSs according to one embodiment of the present invention.
Figure 11:
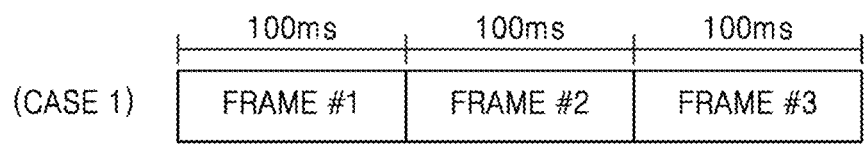
FIG. 11 schematically shows a communication cycle that varies according to a driving condition of a vehicle equipped with a battery according to one embodiment of the present invention.
Figure 11:
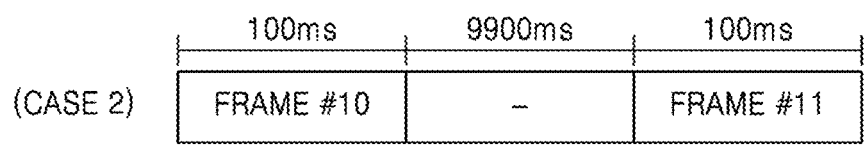

Specifically, as shown in FIGS. 14 and 15, the common-frequency-channel and the communication-frequency-channel may be divided into communication frames having a predetermined cycle (100 ms in FIGS. 14 and 15) with reference to the above description in FIGS. 9 to 11, and each communication frame is composed of multiple sub-frames (4 sub-frames in FIGS. 14 and 15). In addition, the sub-frame of the common-frequency-channel shown in FIG. 14 is composed of downlink frames only, unlike the sub-frames in FIGS. 9 to 11.

More specifically, the common-frequency-channel refers to a channel for allowing the master BMS 2000 to transmit information required for communication performed later to the direct BMS 1000. The broadcasting data broadcasted by the master BMS 2000 to the direct BMSs 1000 through the common-frequency-channel includes an identifier of each of the direct BMSs 1000 and channel information corresponding to the identifier.

For example, channel information #1, which instructs direct BMSs #1 to #25 1000.1 to 1000.25 to communicate through a communication-frequency-channel of the 898.0 MHZ band, may be transmitted as broadcasting data together with identifier information of each of direct BMSs #1 to #25 1000.1 to 1000.25, and channel information #2, which instructs direct BMSs #26 to #50 1000.26 to 1000.50 to communicate through a communication-frequency-channel of the 898.2 MHz band, may be transmitted as broadcasting data together with identifier information of each of direct BMSs #26 to #50 1000.26 to 1000.50.

In addition, as shown in FIG. 14, the present invention adopts a configuration capable of repeatedly transmitting same information by repeatedly arranging the same downlink frame within one sub-frame, so that the multiple direct BMSs 1000 can stably receive the broadcasting data.

In addition, as shown in FIG. 15, the sub-frame of the communication-frequency-channel includes a single downlink frame and multiple uplink frames. The master BMS 2000 broadcasts data including identifier information of each of the multiple direct BMSs 1000 communicating on the corresponding channel and time division information of an uplink frame corresponding to the identifier information, through the downlink frame of the communication-frequency-channel.

In other words, referring to the above example, the master BMS 2000 may broadcast data containing: identifier information, which instructs to communicate with the communication-frequency-channel of the 898.0 MHz band through the downlink frame of the communication-frequency-channel of the 898.0 MHz band, of each of direct BMSs #1 to #25 1000.1 to 1000.25 receiving channel information #1; and time division information of uplink frames assigned to direct BMSs #1 to #25 1000.1 to 1000.25, respectively, and each of direct BMSs #1 to #25 1000.1 to 1000.25 receiving the data may transmit information including a voltage, a current, a temperature and the like for each or all of the battery cells contained in each of battery modules #1 to #25 connected to the direct BMS, based on the time division information of the direct BMS's own uplink frame.

In addition, the data broadcasted by the master BMS 2000 through the downlink frame of the communication-frequency-channel may further include request information about each direct BMS 1000 to be received (for example, an instruction to perform cell balancing).

In addition, FIGS. 14 and 15 show the configuration in which the master BMS 2000 and the direct BMS 1000 simultaneously transmit and receive data through the common-frequency-channel and the communication-frequency-channel. However, Preferably, the direct BMS 1000 cannot receive or transmit data through the communication-frequency-channel while the direct BMS 1000 is receiving the broadcasting data transmitted by the master BMS 2000 through the common-frequency-channel, and can receive and transmit the data on the communication-frequency-channel after the broadcasting data is received through the common-frequency-channel.

In addition, the wireless communication technology for battery diagnosis in the general related art operates a frame error control function, and more specifically, has a configuration of modulating a transmission signal through convolution encoding upon transmission and demodulating a reception signal through Viterbi decoder upon reception. Since the above configuration is included in each sensor node semiconductor for cell diagnosis, space utilization for a battery pack is deteriorated, and a lot of production costs are required.

In order to solve the above-described problems, the present invention is configured to include the configuration in which an on/off function for turning on or off according to radio wave environments is added to the above frame error control configuration and the Viterbi decoder component is excluded. In other words, since the source of radio wave interference is blocked by an aluminum shield of the battery pack in a general radio wave environment, a clean radio wave environment may be created. Thus, the frame error control configuration is turned off, so that the time required for transmission and reception can be shortened, thereby increasing communication efficiency.

In addition, multiple identical sub-frames are configured to be repeatedly arranged in one communication frame, so that the frame error control configuration capable of ensuring communication reliability can be designed without the Viterbi decoder component, and accordingly, the structure of the sensor node can be simplified. In other words, the present invention has the improved frame error control configuration, so that the size of more than dozens of cell diagnosis sensor node semiconductors installed in each vehicle can be reduced, and production costs can be lowered.

In addition, as an exemplary embodiment, the data rate in the common-frequency-channel and the communication-frequency-channel may be designed to be 2 Mbps or more, and the signal-to-noise ratio (SNR) of the communication system of the present invention may be designed as 10-6. In addition, it may be preferable that the reception sensitivity of the communication-frequency-channel is designed to be −85 dBM, and the peak to average power ratio (PAPR) is designed to be 3 to 5.

Figure 16:
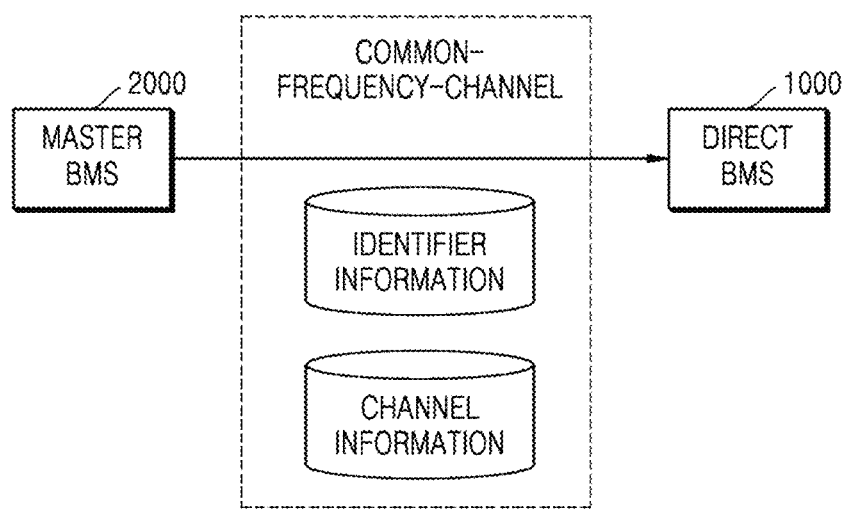
FIG. 16 schematically shows data broadcasted on a common-frequency-channel according to one embodiment of the present invention.
Figure 17:
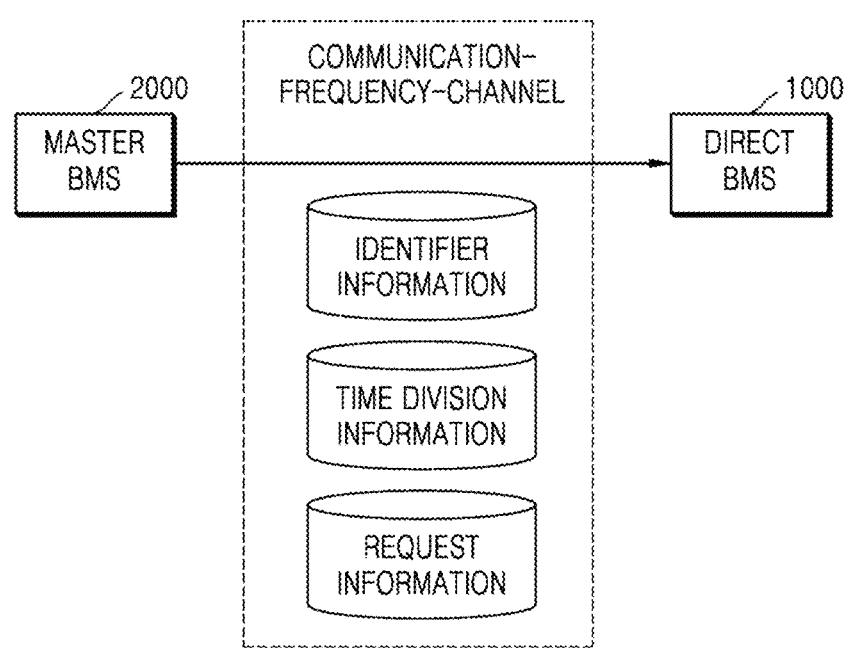
FIG. 17 schematically shows data broadcasted on a communication-frequency-channel according to one embodiment of the present invention.

FIG. 16 schematically shows data broadcasted on the common-frequency-channel according to one embodiment of the present invention. FIG. 17 schematically shows data broadcasted on a communication-frequency-channel according to one embodiment of the present invention.

As a whole, FIGS. 16 and 17 show information transmitted to the direct BMS 1000 through the downlink frame of the common-frequency-channel; and information transmitted to the direct BMS 1000 through the downlink frame of the communication-frequency-channel.

Specifically, as shown in FIG. 16, the master BMS 2000 broadcasts broadcasting information including: identifier information of the direct BMS 1000 through the common-frequency-channel; and channel information related to a communication-frequency-channel communicated with the corresponding direct BMS 1000. Initially, the channel information is preset for each direct BMS 1000. However, the master BMS 2000 may maintain a stable communication state by constantly analyzing the communication status with the direct BMSs 1000 and actively changing the channel information.

As shown in FIG. 17, the master BMS 2000 broadcasts data containing: identifier information of the direct BMS 1000 through the downlink frame of the communication-frequency-channel; time division information of an uplink frame related to a time-slot to be communicated with the corresponding direct BMS 1000; and request information related to an instruction or a control for the corresponding direct BMS 1000. An example of the requested information may include an instruction of requesting voltage values of battery cells connected to the corresponding direct BMS 1000, an instruction of performing cell balancing because the voltage values of the battery cells are irregular beyond a preset range, and an instruction of lowering input/output of the battery because the corresponding direct BMS 1000 has an excessively high temperature.

In addition, initially, the time division information is preset for each direct BMS 1000. However, the master BMS 2000 may maintain a stable communication state by constantly analyzing the communication status with the direct BMSs 1000 and actively changing the time division information.

As described above, the master BMS 2000 may transmit data including channel information and time division information for communication with the direct BMS 1000 prior to the uplink frame, through the downlink frames of two independently operated channels, so that synchronization or the like for communication can be adjusted, and reliability of data transmission and reception can be ensured in the early stage.

FIG. 18 schematically shows steps of performing a self-regulating error correction configuration according to one embodiment of the present invention.

As shown in FIG. 18, when the master BMS 2000 detects a communication error during communication with multiple direct BMSs 1000, the master BMS 2000 may change the time division information of the direct BMS 1000 corresponding to the uplink frame having the occurring communication error, and then broadcast data including the changed time division information through a communication-frequency-channel.

In addition, when the master BMS 2000 detects a communication error during communication with multiple direct BMSs 1000, the master BMS 2000 may change the channel information of the direct BMS 1000 corresponding to the uplink frame having the occurring communication error, and then broadcast broadcasting data including the changed channel information through a common-frequency-channel.

Specifically, referring to FIG. 10, when the master BMS 2000 fails to normally receive data from a specific direct BMS 1000 through a specific uplink frame, information transmitted from the corresponding direct BMS 1000 may be determined based on data received through other uplink frames from the corresponding direct BMS 1000 received in the same communication frame.

However, when the above communication error is repeated more than a preset number of times or for a preset period of time, the present invention actively solves the communication errors through the algorithm shown in FIG. 18, so that communication stability can be ensured.

More specifically, when the master BMS 2000 detects a communication error with a specific direct BMS 1000 more than a preset number of times or for a preset period of time (S100), the master BMS 2000 may changes time division information transmitted to the corresponding direct BMS 1000 (S110), and then broadcast the changed time division information through the downlink frame of the corresponding communication-frequency-channel. The direct BMS 1000 receiving the changed time division information may change time division information of the direct BMS's own uplink frame. Thereafter, when communication is normally performed with the master BMS 2000 without a communication error during a first time preset in the timeslot changed according to the changed time division information (S120), the direct BMS 1000 and the master BMS 2000 perform communication through the uplink frame according to the corresponding time division information.

In addition, when a communication error with the corresponding direct BMS 1000 is also detected in the timeslot changed during the first preset time (S120), the master BMS 2000 change the channel information transmitted to the corresponding direct BMS 1000 (S130), and then broadcast the changed channel information through the common-frequency-channel. The direct BMS 1000 receiving the changed channel information may change the direct BMS's own communication-frequency-channel. Thereafter, when communication is normally performed without a communication error with the master BMS 2000 during a second preset time in the changed communication-frequency-channel (S140), the direct BMS 1000 and the master BMS 2000 perform data transmission and reception on the corresponding communication-frequency-channel.

When the communication error continues after step S130, the master BMS 2000 may create a failure alarm and provide the failure alarm to a user, and take a separate action through the failure alarm.

In addition, in another embodiment of the present invention, step S130 may be performed prior to step S110. In other words, when a communication error is detected, the master BMS 2000 may change channel information of the corresponding direct BMS 1000, and then change the time division information thereafter, so that the communication error may be solved.

According to one embodiment of the present invention, the direct BMS is configured to physically and electrically come into direct contact with the battery cells, thereby measuring the voltage and the current for the battery cells, so that noise generated due to channel switching can be prevented in the related art in which the battery and the direct BMS are indirectly connected through a cable or the like, and accordingly, the reliability of data measured for the battery cells can be increased.

According to one embodiment of the present invention, the direct BMS is configured to physically and electrically come into direct contact with each of the battery cells, thereby measuring voltage information on each of the battery cells, so that the conventional problem that a predetermined number of battery cells among a plurality of battery cells have different voltages and generate noise that cannot be corrected can be solved, and accordingly, data having more reliability can be obtained.

According to one embodiment of the present invention, a master BMS and a plurality of direct BMSs connected to each of a plurality of battery modules perform asynchronous wireless communication, so that the problems caused by applying or installing an isolator to a plurality of positions to prevent electro-magnetic interference from being induced in the wired communication system of the related art, such as deterioration in space efficiency, increase in weight, and increase in cost, can be solved.

According to one embodiment of the present invention, a plurality of direct BMSs and a master BMS connected to each of a plurality of battery modules include a communication modem capable of modulating a digital signal into a differential phase shift modulation signal or demodulating a differential phase shift modulation signal into a digital signal so as to perform asynchronous wireless communication, so that the communication module for performing the asynchronous wireless communication can have a simple structure but have a good frequency efficiency, and stable wireless communication can be implemented even in the special environment of a vehicle.

According to one embodiment of the present invention, the battery module and the direct BMS are physically directly connected without a separate component such as a cable, so that durability against vibration can be improved compared to the conventional vehicle battery management systems, and accordingly, reliability of measured data can be increased even in the special measurement situations such as high-speed driving environments.

According to one embodiment of the present invention, an independent common-frequency-channel for performing downlink communication only is operated, so that reliability of data transmission and reception can be ensured.

According to one embodiment of the present invention, when an error occurs in communication, time division information and channel information of the uplink frame of the direct BMS are individually changed through a self-regulating error correction configuration, so that reliability of the wireless communication system can be ensured.

Although the above embodiments have been described with reference to the limited embodiments and drawings, however, it will be understood by those skilled in the art that various changes and modifications may be made from the above-mentioned description. For example, even though the described descriptions may be performed in an order different from the described manner, and/or the described components such as system, structure, device, and circuit may be coupled or combined in a form different from the described manner, or replaced or substituted by other components or equivalents, appropriate results may be achieved.

Therefore, other implementations, other embodiments, and equivalents to the claims are also within the scope of the following claims.

What is claimed is:

1. A system of diagnosing battery cells positioned inside a vehicle, the system comprising:

multiple direct BMSs disposed inside the vehicle and electrically connected to multiple battery cells included in a battery module; and a master BMS disposed inside the vehicle to perform wireless communication with the direct BMSs, wherein the direct BMS includes:

a battery cell connection unit having ports coming into physically and electrically direct contact with exposed electrodes of the battery cells, respectively;

a voltage measurement unit electrically connected to the battery cell connection unit and having a circuit form to measure a voltage of each battery cell;

a current measurement unit electrically connected to the battery cell connection unit and having a circuit form to measure a current of the battery cell or the battery module;

an MCU; and a first wireless communication unit connected to the MCU to perform wireless communication with the master BMS, wherein the master BMS sets a communication-frequency-channel for each direct BMS located inside the vehicle and broadcasts broadcasting data including channel information about the communication-frequency-channel for each direct BMS on a common-frequency-channel at a preset cycle; and wherein the direct BMS is set to receive data transmitted through the common-frequency-channel, and transmits and receives information related to a battery cell to/from the master BMS through the direct BMS's own communication-frequency-channel included in the broadcasting data received on the common-frequency-channel, wherein the communication-frequency-channel enables bidirectional wireless data communication between the multiple direct BMSs and the master BMS and includes multiple communication frames, each communication frame including one or more sub-frames, each sub-frame including:

a downlink frame broadcast by the master BMS to the direct BMSs; and multiple uplink frames transmitted by each direct BMS to the master BMS, with each uplink frame being temporally divided by time.

2. The system of claim 1, wherein both of a positive terminal and a negative terminal of the battery cell come into direct contact with a port provided in the battery cell connection unit, and the voltage measurement unit measures a voltage of each battery cell.

3. The system of claim 1, wherein the data received by the direct BMSs through the downlink frame in the communication-frequency-channel includes:

identifier information of each direct BMS; and time division information of an uplink frame related to the direct BMS having the corresponding identifier information, wherein each direct BMS transmits data about the battery cell connected to the direct BMS to the master BMS through an uplink frame assigned to the direct BMS, based on time division information and channel information of the direct BMS's own uplink frame included in the data received by the downlink frame.

4. The system of claim 1, wherein each of the communication-frequency-channel and the common-frequency-channel corresponds to a 900 MHZ band, in which types of data transmitted and received through each channel are different from each other.

5. The system of claim 1, wherein the communication-frequency-channel includes multiple narrowband channels divided at 200 KHz intervals in a 900 MHz band.

6. The system of claim 1, wherein a communication frame of the communication-frequency-channel includes multiple identical sub-frames, the sub-frame is temporally configured to have multiple uplink frames subject to preset rules after the downlink frame, data broadcasted in the downlink frame includes request information about a target to be transmitted from each direct BMS, and each direct BMS generates response information according to the request information included in the data broadcasted in the downlink frame, so that data including the response information is transmitted to the master BMS according to the time division information and the channel information of the direct BMS's own uplink frame.

7. The system of claim 6, wherein, when the master BMS detects a communication error during communication with the multiple direct BMS, the master BMS changes the time division information of the direct BMS 1000 corresponding to the uplink frame having the occurring communication error, and then broadcasts data including the changed time division information through a communication-frequency-channel.

8. The system of claim 6, wherein, when the master BMS detects a communication error during communication with the multiple direct BMS, the master BMS changes channel information of a direct BMS corresponding to an uplink frame in which the communication error occurs, and then broadcasts broadcasting data including the changed channel information through a common-frequency-channel.

9. The system of claim 1, wherein a cycle of the communication frame transmitted and received by the direct BMS and the master BMS or a time interval between consecutive data frames varies according to a driving condition of the vehicle in which the battery module is installed.

10. A method of diagnosing battery cells performed by a system of diagnosing the battery cells positioned inside a vehicle and including:

multiple direct BMSs disposed inside the vehicle and electrically connected to multiple battery cells included in a battery module; and a master BMS disposed inside the vehicle to perform wireless communication with the direct BMSs, the method comprising:

physically and electrically bringing a port included in the battery cell connection unit into direct contact with an exposed electrode of each of the battery cells, by a battery cell connection unit of the direct BMS;

measuring a voltage of each battery cell, by a voltage measurement unit of the direct BMS;

measuring a current of the battery cell or the battery module, by a current measurement unit of the direct BMS; and performing wireless communication with the master BMS, by a first wireless communication unit of the direct BMS, wherein the first wireless communication unit is connected to an MCU of the direct BMS, the master BMS sets a communication-frequency-channel for each direct BMS located inside the vehicle and broadcasts broadcasting data including channel information about the communication-frequency-channel for each direct BMS on a common-frequency-channel at a preset cycle, and the direct BMS is set to receive data transmitted through the common-frequency-channel and transmits and receives information related to a battery cell to/from the master BMS through the direct BMS's own communication-frequency-channel included in the broadcasting data received on the common-frequency-channel, wherein the communication-frequency-channel enables bidirectional wireless data communication between the multiple direct BMSs and the master BMS and includes multiple communication frames, each communication frame including one or more sub-frames, each sub-frame including:

a downlink frame broadcast by the master BMS to the direct BMSs; and multiple uplink frames transmitted by each direct BMS to the master BMS, with each uplink frame being temporally divided by time.

* * * * *